United States Patent
Noujeim (10) Patent No.: US 10,917,968 B1
(45) Date of Patent: Feb. 9, 2021

(54) PACKAGE TO PRINTED CIRCUIT BOARD TRANSITION

(71) Applicant: Google LLC, Mountain View, CA (US)

(72) Inventor: Leesa Marie Noujeim, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/719,953

(22) Filed: Dec. 18, 2019

(51) Int. Cl.
| H05K 1/11 | (2006.01) |
| H05K 3/46 | (2006.01) |
| H05K 3/42 | (2006.01) |

(52) U.S. Cl.
CPC ............ *H05K 1/116* (2013.01); *H05K 3/421* (2013.01); *H05K 3/4697* (2013.01); *H05K 2201/0949* (2013.01); *H05K 2201/09509* (2013.01)

(58) Field of Classification Search
CPC ................. H05K 1/111–116; H05K 3/42–429
See application file for complete search history.

(56) References Cited

U.S. PATENT DOCUMENTS

| 3,558,423 | A | 1/1971 | Rossetti, Jr. |
| 7,047,628 | B2 | 5/2006 | Lee |
| 7,755,445 | B2 | 7/2010 | Dutta et al. |
| 2006/0121722 | A1 | 6/2006 | Card et al. |
| 2011/0017507 | A1 | 1/2011 | Hardin |
| 2011/0203834 | A1 | 8/2011 | Yoneya et al. |
| 2014/0262441 | A1 | 9/2014 | Wu |

FOREIGN PATENT DOCUMENTS

EP  0677985  4/1994

*Primary Examiner* — Jeremy C Norris
(74) *Attorney, Agent, or Firm* — Fish & Richardson P.C.

(57) ABSTRACT

Package to printed circuit board (PCB) transitions are described. In one aspect, a multi-layer PCB includes an external layer having a transition region configured to receive an electrical component and a clear routing region outside of the transition region. The PCB includes first via(s) that extend from the transition region to an inner trace routing layer. The trace routing layer is disposed between the external layer and the second inner trace routing layer. The first inner trace routing layer includes a transition area disposed under the transition region of the external layer, a clear routing area outside of the transition region, and a transmission line that connects a given first via to a second via for a second electrical component. The transmission line includes conductive trace(s) that each have a first width in the transition area and a second width, greater than the first width, in the clear routing area.

20 Claims, 3 Drawing Sheets

PACKAGE TO PRINTED CIRCUIT BOARD TRANSITION

BACKGROUND

High-speed printed circuit board (PCB) design makes use of connecting areas of high-density pins or pads, such as ball grid arrays (BGA) or small form-factor pluggable (SFP) connector pins. Traces of PCBs can be routed on the top layer of a multi-layer PCB such that no vias are required. However, microstrip routing on the top layer suffers from increased loss due to a variety of factors, for example: surface roughness since outer layers of a PCB are deliberately roughened to promote adhesion; large variability in characteristic impedance due to thicker metals; and soldermask and other coating effects.

Traces may also be routed on upper inner layers of the PCB accessible by laser blind vias. A via is a hole in a multi-layer circuit board for passing signals from one layer to another. A blind via connects an outer layer of the PCB to an inner layer of the PCB, and is exposed on one side of the PCB. A laser blind via is a blind via formed using a laser to remove dielectric material from a PCB.

A laser blind via maintains the integrity (e.g., no perforations) of planes in lower layers, which has many advantages. However, the reach of laser blind vias is limited due to via aspect ratio requirements. Laser blind vias need to have a larger diameter if they reach deeper into the PCB. In order to reach multiple stripline inner routing layers with a laser via having a diameter compatible with one millimeter (mm) pitch BGA packages, the dielectrics must be thin. Thin dielectrics result in narrow stripline traces, which have high loss.

To minimize loss, thicker dielectrics can be used but may result in access to fewer stripline layers (e.g., to only one stripline layer) using laser blind vias. If additional routing layers are required, they may require through-hole vias for access. These through-hole vias cause lower layer plane perforation, which can be detrimental to power delivery as well as signaling. The through-hole vias also have degraded electrical performance compared with laser blind vias due to residual backdrill stub and increased crosstalk with adjacent long vias.

SUMMARY

This specification describes technologies relating to package to PCB transitions with low loss and low crosstalk.

In general, one innovative aspect of the subject matter described in this specification can be embodied in multi-layer printed circuit boards that include an external layer having (i) a transition region configured to receive a first electrical component and (ii) a clear routing region outside of the transition region; multiple vias including one or more first vias that extend from the transition region to a first inner trace routing layer of the printed circuit board and one or more second vias that extend from the transition region to a second inner trace routing layer of the printed circuit board, the first inner trace routing layer being disposed between the external layer and the second inner trace routing layer; a first dielectric layer between the external layer and the first inner trace routing layer, the first dielectric layer including a first dielectric material. The first inner trace routing layer includes a transition area disposed under the transition region of the external layer; a clear routing area outside of the transition area; and a transmission line that connects a given first via to a second via for a second electrical component, wherein the transmission line includes one or more conductive traces that each have a first width in the transition area and a second width in the clear routing area, wherein the second width is greater than the first width. Other implementations of this and other aspects include corresponding systems and methods for fabricating the printed circuit board.

These and other implementations can each optionally include one or more of the following features. In some aspects, the one or more conductive traces include one or more stripline traces in the transition area and one or more microstrip traces in the clear routing area. Some aspects can include a first ground plane in the transition region of the external layer, a second ground plane disposed between the first inner trace routing layer and the second inner trace routing layer, and a second dielectric layer disposed between the first inner trace routing layer and the second ground plane. The one or more stripline traces, the first ground plane, the second ground plane, the first dielectric layer, and the second dielectric layer form a stripline transmission line. In some aspects, the clear routing region of the external layer does not include a ground plane, the second ground plane is disposed under the transition region and the clear routing region of the external layer, and the one or more microstrip traces, the second ground plane, and the second dielectric layer form a microstrip transmission line.

In some aspects, at least one first via comprises a laser blind via and at least one second via comprises a laser blind via. Each laser blind via electrically couples a pad on the external layer to a corresponding pad on corresponding clear routing layer.

In some aspects, the electrical component includes one of an integrated circuit package or a pluggable connector. In some aspects, for one or more adjacent pairs of first vias in the transition region, a combination of a space between the pair of first vias and a required clearance between each first via and a trace is less than the second width.

In general, another innovative aspect of the subject matter described in this specification can be embodied in multi-layer printed circuit boards that include an external layer having (i) a transition region configured to receive a first electrical component and (ii) a clear routing region outside of the transition region, a first inner trace routing layer disposed between the external layer and a second inner trace routing layer. The first inner trace routing layer includes a transition area disposed under the transition region of the external layer, a clear routing area outside of the transition area, and a transmission line that connects a given first via to a second via for a second electrical component, wherein the transmission line includes one or more conductive traces that each have a first width in the transition area and a second width in the clear routing area, wherein the second width is greater than the first width. Other implementations of this and other aspects include corresponding systems and methods for fabricating the printed circuit board.

These and other implementations can each optionally include one or more of the following features. In some aspects, the one or more conductive traces include one or more stripline traces in the transition area and one or more microstrip traces in the clear routing area. Some aspects include a first ground plane in the transition region of the external layer, a second ground plane disposed between the first inner trace routing layer and the second inner trace routing layer, a first dielectric layer disposed between the external layer and the first inner trace routing layer, and a second dielectric layer disposed between the first inner trace routing layer and the second ground plane. The one or more stripline traces, the first ground plane, the second ground plane, the first dielectric layer, and the second dielectric layer form a stripline transmission line.

In some aspects, the clear routing region of the external layer does not include a ground plane, the second ground plane is disposed under the transition region and the clear routing region of the external layer, and the one or more microstrip traces, the second ground plane, and the second dielectric layer form a microstrip transmission line.

Some aspects can include multiple vias including one or more first vias that extend from the transition region to the first inner trace routing layer and one or more second vias that extend from the transition region to the second inner trace routing layer. At least one first via can include a laser blind via and at least one second via comprises a laser blind via. In some aspects, each laser blind via electrically couples a pad on the external layer to a corresponding pad on corresponding clear routing layer.

In some aspects, for one or more adjacent pairs of first vias in the transition region, a combination of a space between the pair of first vias and a required clearance between each first via and a trace is less than the second width. In some aspects, the electrical component comprises one of an integrated circuit package or a pluggable connector.

In general, another innovative aspect of the subject matter described in this specification can be embodied in methods that include generating a layout of traces for each trace routing layer of the printed circuit board, wherein the printed circuit board comprises a first core having an external layer, a second core having a first inner trace routing layer, and a third core having a second inner trace routing layer, wherein the external layer comprises (i) one or more transition regions configured to receive an electrical component and (ii) one or more clear routing regions outside of the one or more transition regions; etching conductive material from each inner trace routing layer to form transmission lines on each inner trace routing layer; attaching the first core to the second core using prepreg material; attaching the second core to the third core using prepreg material; and creating one or more first vias that extend from the transition region to the first inner trace routing layer and one or more second vias that extend from the transition region to the second inner trace routing layer, wherein: the first inner trace routing layer comprises: a transition area disposed under the transition region of the external layer; a clear routing area outside of the transition area; and a transmission line that includes one or more conductive traces that each have a first width in the transition area and a second width in the clear routing area, wherein the second width is greater than the first width. Other implementations of this and other aspects include corresponding systems, methods, and computer programs, configured to perform the actions of the methods, encoded on computer storage devices.

These and other implementations can each optionally include one or more of the following features. In some aspects, generating the layout of traces for each trace routing layer of the printed circuit board can include generating traces having the first width in one or more transition areas of each trace routing layer that will be disposed under a respective transition region of the external layer and generating traces having the second width in one or more clear routing areas of each trace routing layer that is outside of each transition area outside of each transition area.

In some aspects, the one or more conductive traces include one or more stripline traces in the transition area and one or more microstrip traces in the clear routing area. In some aspects, the printed circuit board can include a first ground plane in the transition region of the external layer, a second ground plane disposed between the first inner trace routing layer and the second inner trace routing layer, a second dielectric layer disposed between the first inner trace routing layer and the second ground plane. The one or more stripline traces, the first ground plane, the second ground plane, the first dielectric layer, and the second dielectric layer form a stripline transmission line.

The subject matter described in this specification can be implemented in particular embodiments so as to realize one or more of the following advantages. The width of conductive traces that connect integrated circuits (ICs) or other electrical components (e.g., SFP connectors) that require large areas of high-density pins or pads ("high density components") can vary in different regions of the circuit board to allow for shorter vias while maintaining wide traces (in many places) for low transmission line loss. The width of the traces can be smaller on an inner layer that is under the transition region(s) of the PCB (the regions at which ICs, SFP connectors, or other high-density electrical components are attached to the external layer of the PCB) than the width of the traces in clear routing regions (the regions outside of the transition regions where no high-density electrical components are attached to the external layer). As described below, a high-density electrical component is an electrical component that includes at least a threshold number of pins, pads, or other connectors that connect to pads or through-holes of a PCB per unit area. This allows for wider conductive traces for large portions of the length of the traces to reduce transmission line loss, while also maintaining thin dielectrics that enable loss crosstalk and no stubs (e.g., no residual backdrill stubs) in the transition region.

The thinner dielectric material allows depth-limited vias, such as laser blind vias that have required aspect ratios that limit their depth into the PCB, to reach more inner layers of the PCB. The shorter vias based on the thinner dielectric material also reduces crosstalk between vias. By reaching more inner layers in the transition region, a larger number of traces can be used to route signals to and from high-density electrical components, allowing for more connections to ICs per unit area of the external layer of the PCB.

Various features and advantages of the foregoing subject matter is described below with respect to the figures. Additional features and advantages are apparent from the subject matter described herein and the claims.

BRIEF DESCRIPTION OF THE DRAWINGS

Like reference numbers and designations in the various drawings indicate like elements.

DETAILED DESCRIPTION

In general, systems and techniques described herein relate to package to PCB transitions. A package to PCB transition is a group of components and a region of a PCB for electrically connecting electrical components (e.g., ICs, pluggable connectors, etc.) to other regions of the PCB. The group of components can include conductive pads or through-holes to which the components are electrically coupled to an external layer of the PCB, vias from the external layer to internal routing layers of the PCB, and transmission lines on the inner layers that route electrical signals to and from the transition region, and the transition region itself.

The transition region for an electrical component is the region of the PCB that is configured to receive the component. This transition region can include the region of the external layer that will be covered by the electrical component and/or a region that includes the conductive pads or through-holes that electrically couple the electrical component to the PCB. For high-density electrical components, such ICs and SFP connectors, this region can include a large number of conductive pads, e.g., greater than a threshold number such as 8, 10, 14, or another appropriate number of pads). For the purposes of this document, a high-density electrical component is a component that includes at least a threshold number of pins, pads, or other connectors that connect to pads or through-holes of a PCB per unit area. For example, a high-density electrical component may be a component that has at least 10 connectors in an area no greater than one square centimeter ($cm^2$).

The width of the conductive traces on one or more internal layers of the PCB can vary across different regions of the PCB. Wider conductive traces generally provide lower transmission line loss. However, for stripline and microstrip traces of PCBs, wider conductive traces typically require thicker dielectric material to provide an appropriate impedance for the trace. With a thinner dielectric material between the first inner layer and the external layer, narrower traces can be used in the transition region under a high-density electrical component where the density of traces is greater. Wider traces can be used in clear routing regions outside of the transition region(s). For example, the portions of conductive traces of a transmission line that are in the clear routing region can be at least a threshold percentage, e.g., 30%, 50%, or another appropriate percentage, wider than the conductive traces of the transmission line that are in the transition region.

The thinner dielectric allows for shorter vias (e.g., shorter than vias required for conductive traces on thicker dielectrics typically associated with wider traces) to the first inner layer. This allows for laser blind vias to be used and provides less crosstalk between adjacent vias. This also allows depth-limited vias, such as laser blind vias, to reach more inner layers of the PCB. For example, this can allow the dielectric material between the external layer and the first inner layer to be about 1 mil in some implementations. The wider traces in the clear routing region also provide less transmission line loss than using the narrower traces throughout the first inner layer. As the length of the portion of the transmission line that is in the clear routing region is typically much longer than the length of the portion of the transmission line in the transition region, this can significantly reduce the transmission line loss than if the narrower trace was used throughout.

In a particular example, a transmission line on the first inner layer can be made of one or more narrower stripline traces under the transition region and made of one or more wider microstrip traces under the clear routing region(s). These microstrip traces can also be referred to as embedded microstrip as there is dielectric, but no ground plane, above the microstrip. A microstrip trace includes a flat conductive strip that is separated from a ground plane by a layer of dielectric material. A stripline includes a flat conductive strip that is suspended between two ground planes. The conductive strip and the ground places are separated by layers of dielectric material. In this example, a ground plane can cover the transition region on the external layer, but not cover the clear routing region outside of the transition region. This ground plane in combination with a ground plane on the other side of the first inner layer forms the stripline in the transition region.

Figure 1:
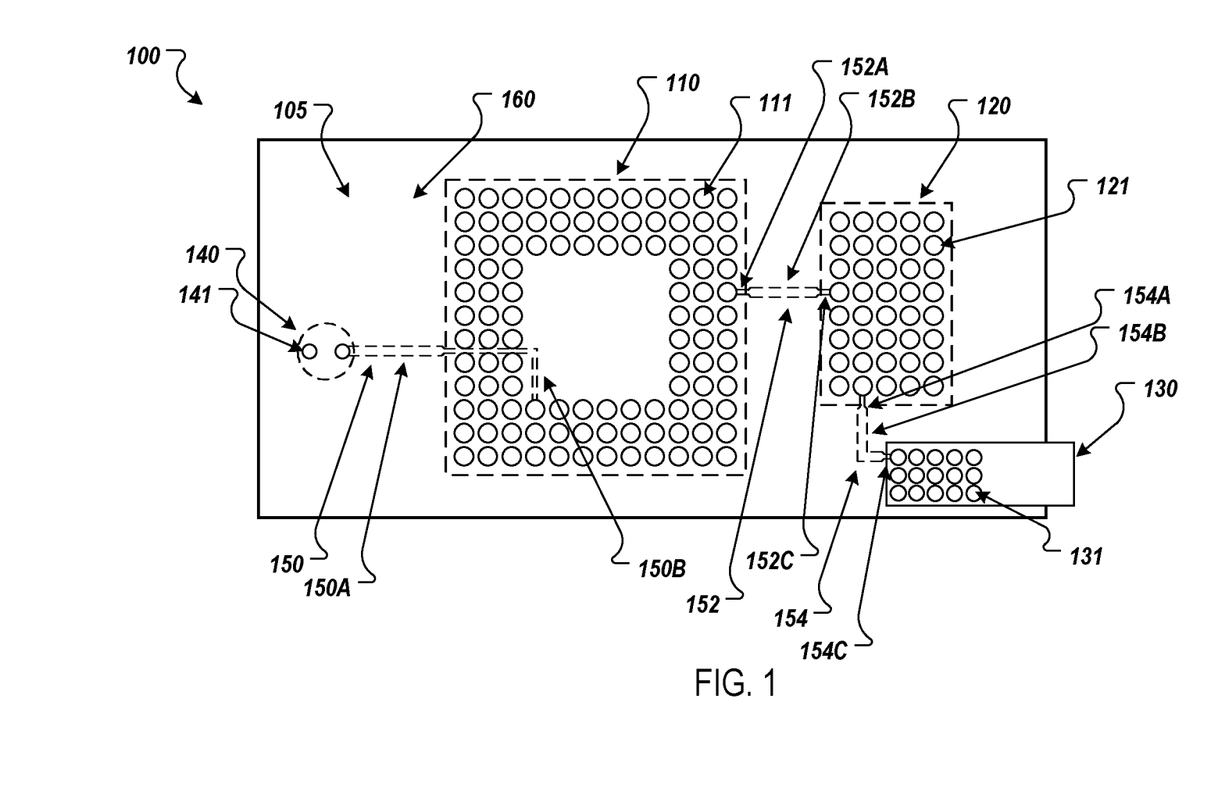
FIG. 1 is a block diagram that illustrates an external layer of a multi-layer PCB.
Figure 2A:
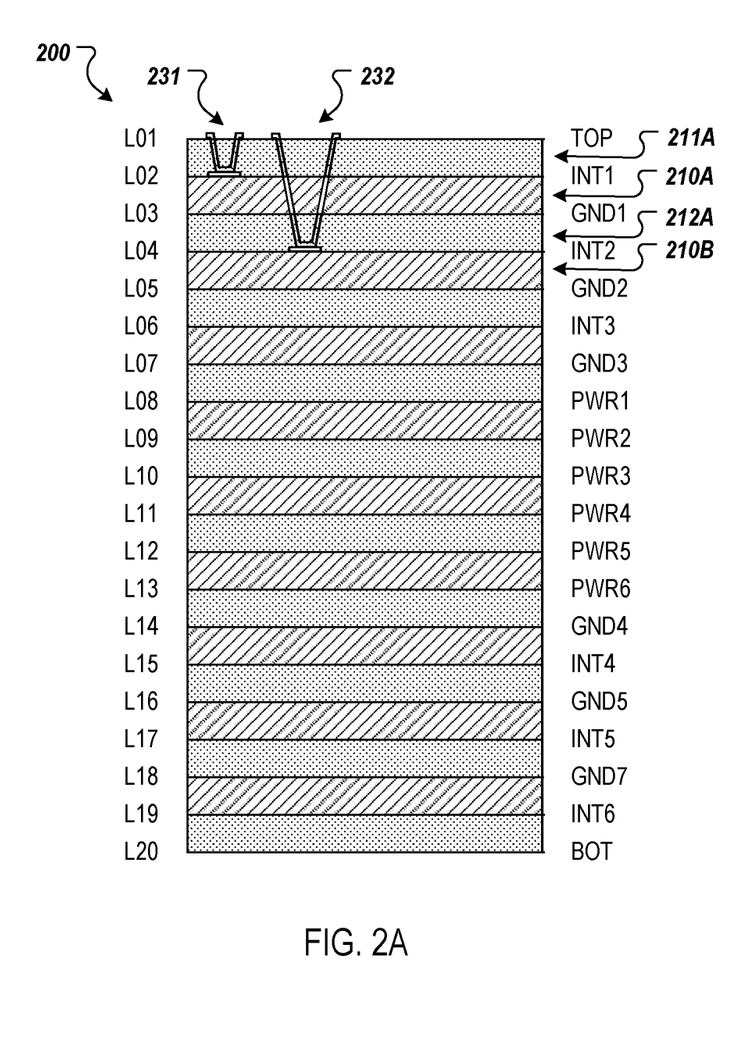
FIG. 2A is a cross-sectional view of a multi-layer PCB.
Figure 2B:
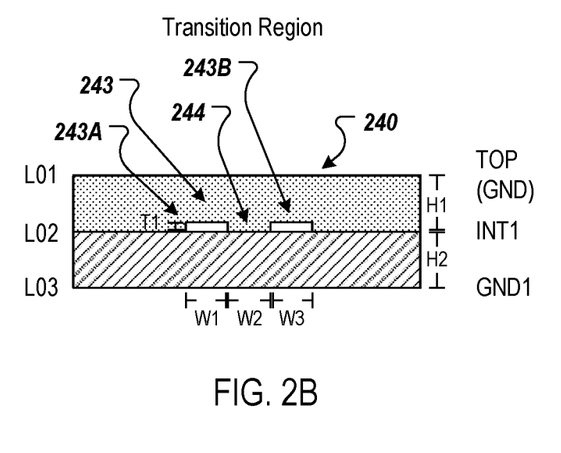
FIG. 2B is a cross-sectional view of a portion of the multi-layer PCB of FIG. 2A.
Figure 2C:
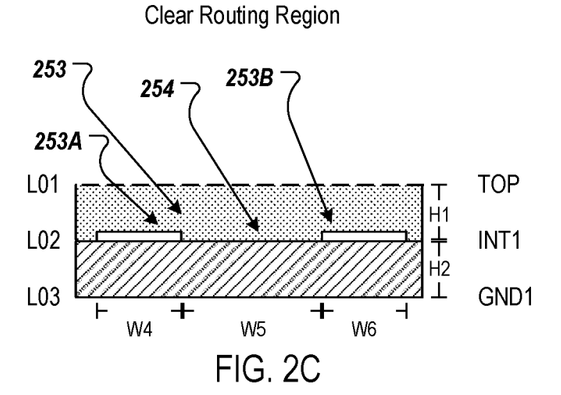
FIG. 2C is a cross-sectional view of another portion of the multi-layer PCB of FIG. 2A.

FIG. 1 is a block diagram that illustrates an external layer 105 of an example multi-layer PCB 100. The relative dimensions in each figure are illustrative only and not necessarily to scale. The PCB 100 can also include one or more internal layers, as shown in FIGS. 2A-2C and described below. The external layer 105 can include conductive pads and/or through-holes for receiving and electrically connecting the PCB 100 to electrical components. In this example, the external layer 105 includes through-holes 141 for receiving a capacitor, conductive pads 111 for receiving a first IC having a BGA, conductive pads 121 for receiving a second IC having a BGA, and through-holes 131 for receiving an SFP connector, e.g., for receiving a cage of the connector. The SFP connector can be one of various forms of SFP connectors, such as oSFP, 2SFP, 2SFPDD, DSFPP, or SFPDD. The PCB 100 can include through-holes or conductive pads for receiving other types of components, including other types of high-density components.

The through-holes 131 and 141 can receive pins of the capacitor and the SFP connector, respectively. The pins can then be soldered to a conductive pad around the through-holes 131 and 141. Similarly, pads of the BGAs can be soldered to corresponding conductive pads 111 and 121 of the PCB 100. For example, the BGAs of the ICs can include solder balls that are heated to melt the solder and then cooled to form a bond between the conductive pads 111 and 121 and the corresponding BGA pads.

As shown in FIG. 1, the density of the conductive pads 111 and 121 and the through-holes 131 for the SFP connector is much greater than that of the capacitor. The PCB 100 includes a transition region for each component. For example, the PCB 100 includes a transition region 140 for the capacitor, a transition region 110 for the first IC, a transition region 120 for the second IC, and a transition region 130 for the SFP connector.

The transition region for a component can be defined by the location of the through-holes or conductive pads. In general, the transition region can include all the through-holes or conductive pads for the component. For example, the transition region 110 can be defined by the outer-most conductive pads 111. In the illustrated example, the transition region 110 is a rectangular-shaped region that is offset from the outer-most conductive-pads by a short distance, e.g., 2 mm, 5 mm, or another appropriate distance. In another example, the transition region 110 can be a rectangular-shape defined by straight lines that go through an outer-most point on each outer-most conductive pad.

The transition region for each component can extend to one or more of the internal layers of the PCB 100. That is, the region of an inner layer that is under the transition region of the external layer 105 for a component can also be considered the transition region for the component or a transition area of that inner layer.

The PCB 100 also includes a clear routing region 160. The clear routing region 160 is the region of the external layer 105 (and the same region of one or more inner layers) that is outside of the transition regions 110, 120, 130, and 140 of the external layer 105. That is, the area of the external layer 150 around the transition regions 110, 120, 130, and 140, between the transition regions 110, 120, 130, and 140, and otherwise not consumed by a transition region can be considered the clear routing region 160. There is generally more space to route transmission lines on the external layer and on the inner layers of the PCB 100 in the clear routing region 160. In some implementations, a clear routing region is a region that includes vias and the vias are spaced apart such that the width between vias in the clear routing region allow for wider traces (e.g., having at least a threshold width, such as at least a width of 5 mil, 7, mil, or another appropriate threshold width) to pass.

In some implementations, the clear routing region 160 can include the transition regions for components that are not considered high-density components. As the number of pads or through-holes in these transition regions is lower than for high-density components and the vias can be spaced further apart than in the transition region, wide traces can pass through these clear routing regions. For example, the width of the traces in the clear routing region 160 can exceed the distance between vias in the transition regions 110, 120, 130, and 140. In a particular example, at least a portion of the vias in the transition region are spaced apart a distance that is less than the width of the traces in the clear routing region.

The PCB 100 includes transmission lines formed on the inner layers of the PCB 100 that electrically connect components mounted on the external layer 150 of the PCB 100. For example, the PCB includes a transmission line 150 that connects a conductive pad 111 for the first IC to a through-hole 141 for the capacitor, a transmission line 152 that connects a conductive pad 111 for the first IC to a conductive pad 121 for the second IC, and a transmission line 154 that connects a conductive pad 121 for the second IC to a through-hole 131 for the SFP connector. Of course, the PCB 100 can include many more transmission lines that connect these components and/or other components.

The transmission lines 150, 152, and 154 can be formed on an inner layer of the PCB 100. For example, the transmission lines 150, 152, and 154 can be formed on the first inner trace routing layer that is below the external layer. As shown in FIG. 2A and described below, a multi-layer PCB can include multiple trace routing layers between the two external layers. The internal layers can be separated by dielectric material.

The transmission lines 150, 152, and 154 can connect pads of vias to pads of other vias. For example, the transmission line 150 can connect to a via that connects the conductive pad 111 to the first inner layer of the PCB. The vias can be laser blind vias, as described below.

The transmission line 150 includes a first portion 150A and a second portion 150B. Each portion can include a single trace or multiple traces, e.g., two differential traces. The first portion 150A is routed through the clear routing region 160 and the second portion 150B is routed through the transition region 110. In the transition region 110, the width of the conductive trace(s) that form the transmission line are narrower than the width of the conductive trace(s) in the clear routing region 160. That is, the width of the conductive trace(s) of the first portion 150A are wider than the conductive trace(s) of the second portion 1506, as shown in FIG. 1. Once the transmission line 150 enters the transition region (e.g., transitions from the first portion 150A to the second portion 150B), the width of the conductive trace(s) can be reduced and the space between adjacent traces can also be reduced. The width can be reduced gradually or at once, e.g., with a wider trace in the clear routing region contacting a narrower trace in the transition region.

The widths of the traces in each portion can be selected so that the characteristic impedance of the first portion 150A matches the characteristic impedance of the second portion 1506. For example, the width of traces in the first portion 150A can be greater than a distance between vias in the transition region 110, while the width of the traces in the second portion 1506 can be less than the distance between vias in the transition region 110. As described above, the wider traces in the clear routing region 160 reduces transmission line loss for the transmission line 150.

The transition from the narrower trace(s) to the wider trace(s) can occur at the border of the transition region 110 and the clear routing region 160 where the transmission line 150 exits the transition region 110. In another example, the transition from the narrower trace(s) to the wider trace(s) can occur a short distance outside of the transition region 110, e.g., within 40-400 mils of the transition region 110.

In some implementations, the first portion 150A of the transmission line 150 includes one or more microstrip traces and the second portion 1506 includes one or more stripline traces. As described above, a microstrip trace includes a flat conductive strip that is separated from a ground plane by a layer of dielectric material and a stripline includes a flat conductive strip that is suspended between two ground planes. To form the microstrip and stripline portions, a ground plane can be placed below the inner layer on which the transmission line 150 is formed. In addition, a ground plane can be placed below (or over) the transition region 110, e.g., under the external layer 105. In this way, the second portion 1506 is suspended between two ground planes forming one or more stripline traces and the first portion 150A is separated from the ground plane below the inner layer forming one or more microstrip traces. Example locations for ground planes in a multi-layer PCB are illustrated in FIGS. 2A-2C and described below.

Similarly, the transmission line 152 includes a first portion 152A, a second portion 152B, and a third portion 152C. The first portion 152A is routed through the transition region 110, the second portion 152B is routed through the clear routing region 160, and the third portion 152C is routed through the transition region 120. Thus, the conductive trace(s) of the second portion 152B are wider than the conductive trace(s) of the first portion 152A and the third portion 152C. The widths of the traces in each portion can be selected so that the characteristic impedance of the first portion 152A matches the characteristic impedance of the second portion 152B and the third portion 152C.

The second portion 152B can include one or more microstrip traces and the first and third portions can include one or more stripline traces. For example, a ground plane can be placed over the transition region 110 and another ground plane can be placed over the transition region 120, with no ground plane being placed over the clear routing region 160.

The transmission line 154 also includes a first portion 154A, a second portion 154B, and a third portion 154C. The first portion 154A is routed through the transition region 120, the second portion 154B is routed through the clear routing region 160, and the third portion 154C is routed through the transition region 130. Thus, the conductive trace(s) of the second portion 154B are wider than the conductive trace(s) of the first portion 154A and the third portion 154C. The widths of the traces in each portion can be selected so that the characteristic impedance of the first portion 154A matches the characteristic impedance of the second portion 154B and the third portion 154C.

The second portion 154B can include one or more microstrip traces and the first and third portions can include one or more stripline traces. For example, a ground plane can be placed over the transition region 120 and another ground plane can be placed over the transition region 130, with no ground plane being placed over the clear routing region 160. Thus, in this example, a ground plane can be placed over each transition region 110, 120, and 130, with no ground plane over the remaining portions of the external layer 150.

In some implementations, the transmission lines 154 that connect to pads or through-holes for receiving SFP connectors can be routed on the external layer 105 before being routed to the first inner layer. Routing of transmission lines from SFP connectors have traditionally been hampered by the need to relieve (e.g., void) the ground plane under the high speed signal pad for the SFP connector. The third portion 154C of the transmission line 154 can be a wide microstrip that is routed on the external layer referencing the ground plane below the first inner layer. This reduces the capacitive discontinuity and voiding of the ground plane at the external layer 105 can be avoided. Once some distance away from the pad, a laser blind via can be used to transition from the microstrip on the external layer 105 (as it has higher loss due to the surface roughness) to embedded microstrip that is located, for example, on the first or second inner layer of the PCB 100. This transition can occur in the transition region 130 or outside of the transition region 130.

FIGS. 2A-2C illustrate portions of a multi-layer PCB 200. FIG. 2A is a cross-sectional view of the multi-layer PCB 200. FIG. 2B is a cross-sectional view of a portion of the PCB 200 and FIG. 2C is a cross-sectional view of another portion of the PCB 200. The example PCB 200 includes 20 layers, L01-L20. The layers L01 and L20 are external layers, with layer L01 being labeled as the top layer and layer L20 being labeled as the bottom layer.

The PCB 200 can be formed by stacking multiple cores on top of each other. In the context of PCBs, a core is a layer of dielectric material that has a copper foil attached to both sides. Each hatched region in FIG. 2A can represent the dielectric material of each of ten cores. For example, a core 210A includes dielectric material in the hatched portion with a copper foil attached to each side. The top side of the core 210A is the first inner route tracing layer INT1 on layer L02 and the bottom side of the core 210A is a ground plane GND1.

The PCB 200 can include a pre-impregnated bonding sheet (prepreg) between adjacent cores. For example, the PCB 200 includes prepreg 212A between cores 210A and 210B. The prepreg holds the cores together. In addition, the PCB 200 can include prepreg 211A between the core 210A and the top external layer L01. The bottom layer L20 can be formed in the same manner. This prepreg attaches the external layers to the cores.

The PCB 200 includes three inner trace routing layers on each side of the PCB 200. In particular, the PCB 200 includes trace routing layers at layers L02, L04, L06, L15, L17, and L19. The PCB 200 also includes ground planes between pairs of trace routing layers and between the trace routing layers and the power routing layers. For example, the PCB 200 includes ground planes on layers L03, L05, L07, L14, L16, and L18. These ground planes can cover their entire layers or substantially all of their layers.

The PCB 200 includes two vias 231 and 232. In this example, the vias 231 and 232 are laser blind vias formed using laser drilling. Other types of vias, such as through-hole vias can also be used. However, laser blind vias have better electrical performance and do not cause lower layer plane perforation.

The first via 231 extends from the top layer L01 to the first inner trace routing layer L02 (INT1) to provide an electrical path from the top layer L01 to the first inner trace routing layer L02. The second via extends from the top layer L01 to the second inner trace routing layer L04 (INT2) to provide an electrical path from the top layer L01 to the second inner trace routing layer L04. Of course, the PCB 200 can include more vias to L02 and L04. In addition, the PCB 200 can include similar vias from the bottom layer L20 to the internal trace routing layers L17 (INT5) and L19 (INT6).

Referring now to FIG. 2B, this cross-sectional view shows a transmission line 243 made of two conductive traces 243A and 243B that are formed on the first inner trace routing layer L02 and that are routed in a transition region of the PCB 200. In this view, the conductive traces 243A and 243B run in a direction into and out of the page. In some implementations, the conductive traces 243A and 243B are embedded in the dielectric material disposed between the first inner trace routing layer L02 and the inner layer L03 that includes the ground plane such that the traces 243A and 243B have dielectric material between them.

In the transition region, the top layer L01 includes a ground plane 240, e.g., disposed on the top layer L01. The ground plane of the top layer, the ground plane of layer L03, the conductive traces 243A and 243B, the dielectric material of the prepreg between the ground plane of the top layer L01 and the conductive traces 243A and 243B, and the dielectric material between the ground plane of layer L03 and the conductive traces 243A and 243B form a stripline transmission line as the conductive traces 243A and 243B are suspended between two ground planes. In this example, the transmission line 243 is an edge-coupled differential stripline transmission line with two differential conductive traces 243A and 243B.

The dimensions and characteristics of the conductive traces 243A and 243B, the prepreg between the ground plane of the top layer and the conductive traces 243A and 243B, and the dielectric material between the ground plane of layer L03 and the conductive traces 243A are selected to provide a target characteristic impedance for the transmission line 243. For example, the impedance can be based on the thickness T1 of the conductive traces 243A and 243B, the width W1 and W3 of the conductive traces 243A and 243B (which are typically the same), the width W2 of the space between the conductive traces 243A and 243B, the height H1 of the prepreg, the height H2 of the dielectric material, and the dielectric constants of the prepreg and the dielectric material.

Referring now to FIG. 2C, this cross-sectional view shows a transmission line 253 made of two conductive traces 253A and 253B that are formed on the first inner trace routing layer L02 and that are routed in a clear routing region of the PCB 200. In this view, the conductive traces 253A and 253B run in a direction into and out of the page. In some implementations, the conductive traces 253A and 253B are embedded in the dielectric materiel disposed between the first inner trace routing layer L02 and the inner layer L03 that includes the ground plane such that the traces 253A and 253B have dielectric material between them.

In the clear routing region, the top layer L01 does not include a ground plane. Thus, the ground plane of inner layer L03, the conductive traces, and the dielectric material between the ground plane of inner layer L03 and the conductive traces 253A and 253B form a microstrip transmission line separated from and referencing the ground plane of inner layer L03. In this example, the transmission line 253 is an edge-coupled differential microstrip transmission line with two differential conductive traces 253A and 253B.

The dimensions and characteristics of the conductive traces 253A and 253B and the dielectric material between the ground plane of layer L03 and the conductive traces 253A are selected to provide a target characteristic impedance for the transmission line 253. For example, the impedance can be based on the thickness T1 of the conductive traces 253A and 253B, the width W4 and W6 of the conductive traces 253A and 253B (which should be the same), the width W5 of the space between the conductive traces 253A and 253B, the height H2 of the dielectric material, and the dielectric constant of the dielectric material.

Although illustrated as two different transmission lines, the transmission lines 243 and 253 can be different portions of the same transmission line that is connecting two electrical components. For example, the transmission line 243 can be a portion that is routed through a transition region and the transmission line 253 can be a portion that is routed through a clear routing region. The transmission line 243 can transition to the transmission line 253 by exiting an area of the first inner routing layer L02 that is covered by a ground plane on the top layer L01.

If the transmission lines 243 and 253 are portions of the same transmission line, the characteristics and dimensions of the traces 243A, 243B, 253A, and 253B, the dielectric materials between layers L01 and L02 (e.g., prepreg material), and the dielectric material between layers L02 and L03 can be selected such that the characteristic impedance of the transmission line 243 matches the characteristic impedance of the transmission line 253. In addition, the widths W4 and W6 of the conductive traces 253A and 253B should be greater than the widths W1 and W3 of the conductive traces 243A and 243B to reduce the transmission line loss in the clear routing region where the traces can be wider and spaced further apart.

By having narrower stripline traces in the transition region and wider microstrip traces in the clear routing region, the height H1 of the dielectric material between layers L01 and L02 (e.g., the prepreg material) can be reduced. For example, the height H1 can be less than the height H2 of the dielectric material between layers L02 and L03. In a particular example, the height H1 can be about 1 mil, while the height H2 is more than 2 mil. This allows laser blind vias to reach both layers L02 and L04. By maintaining thicker dielectrics below layer L02, the microstrip traces on layer L02 can be wider.

Figure 3:
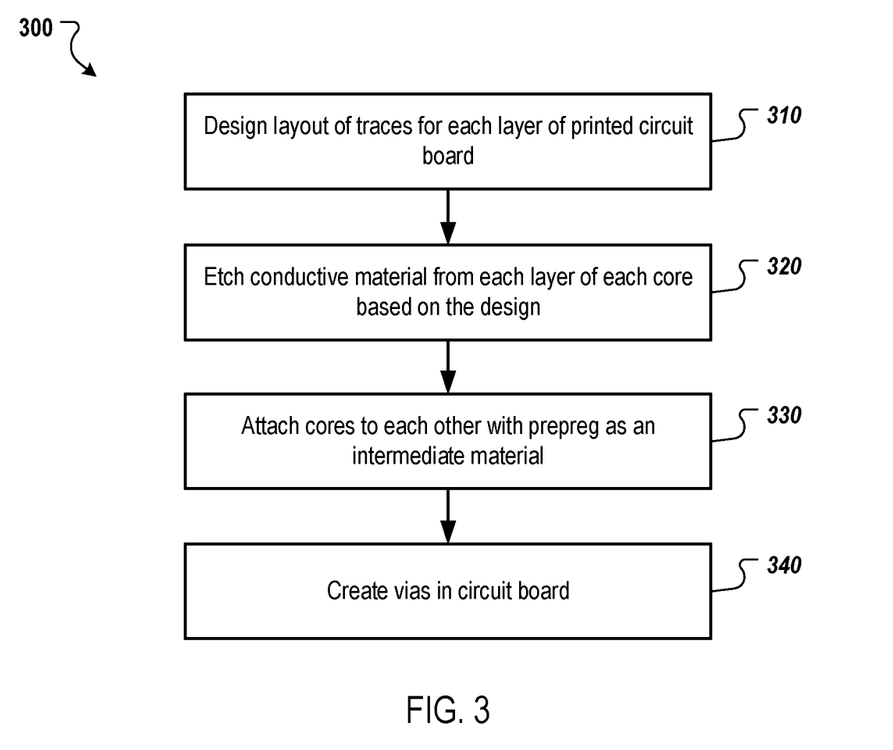
FIG. 3 is a flow diagram that illustrates an example process for fabricating a multi-layer PCB.

FIG. 3 is a flow diagram that illustrates an example process 300 for fabricating a multi-layer PCB. The process 300 can be performed by a system that includes one or more data processing apparatus and fabrication equipment.

The system designs a layout of traces for each layer of a PCB (310). The system can layout the traces based on a circuit diagram that specifies connections between the electrical components of the circuit and based on a layout of the external layer of the PCB that specifies the pads for each pin or pad of each electrical component.

The system can route traces from high-density components using transmission lines with varying widths for different regions of the PCB. The system can route a transmission line from a high-density electrical component using one or more conductive traces having a first width through one or more transition regions. For example, the system routes a transmission line with trace(s) having the first width when escaping from the transition region of the high-density electrical component. The system can then route the transmission line with one or more conductive traces having a second width through a clear routing region outside of the transition region(s). If the transmission line enters another transition region, the system can route the transmission line through the transition region with one or more conductive traces having the first width. The first width can be less than the second width.

In a particular example, the system can route the transmission line on a first inner trace routing layer disposed below an external layer of the PCB using one or more stripline traces and one or more microstrip traces. Narrower stripline traces can be used in the transition region(s) and wider microstrip traces can be used in the clear routing regions. The system can determine the locations of ground planes for the external layer based on the location of the stripline traces as the stripline traces require a second ground plane.

The system etches conductive material from each layer of each core based on the design (320). As described above, each core can include a layer of dielectric material that has a copper foil attached to both sides. The system can etch away the copper from the side of a core that will be used as a trace routing layer based on the layout of the transmission lines on that layer. For example, the system can etch away the copper to form conductive traces of the transmission lines based on the layout of the traces in the design.

The system attaches the cores to each other (330). The system can attach the cores to each other using a prepreg material as an intermediate material between pairs of cores. The prepreg material between cores that have trace routing layers can have a specified height to ensure that the impedance of the traces is appropriate based on the design.

The system creates vias in the PCB (340). At least some of the vias can be depth-limited vias, such as laser blind vias. Laser blind vias can be created using a laser to remove dielectric material. The system can create the vias based on a layout of the vias, e.g., specified by the design created in operation 310. At this point, electrical components can be attached to the PCB. Of course, the process 300 can include other operations, e.g., for preparing the cores for etching, removing dry-film resist after etching, chemically treating panels to improve adhesion, etc.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit).

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described.

Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. A multi-layer printed circuit board comprising:
   an external layer having (i) a transition region configured to receive a first electrical component and (ii) a clear routing region outside of the transition region;
   a plurality of vias including one or more first vias that extend from the transition region to a first inner trace routing layer of the printed circuit board and one or more second vias that extend from the transition region to a second inner trace routing layer of the printed circuit board, the first inner trace routing layer being disposed between the external layer and the second inner trace routing layer;
   a first dielectric layer between the external layer and the first inner trace routing layer, the first dielectric layer comprising a first dielectric material;
   the first inner trace routing layer comprising:
      a transition area disposed under the transition region of the external layer;
      a clear routing area outside of the transition area; and
      a transmission line that connects a given first via to a second via for a second electrical component, wherein the transmission line includes one or more conductive traces that each have a first width in the transition area and a second width in the clear routing area, wherein the second width is greater than the first width.

2. The multi-layer printed circuit board of claim 1, wherein the one or more conductive traces include one or more stripline traces in the transition area and one or more microstrip traces in the clear routing area.

3. The multi-layer printed circuit board of claim 2, further comprising:
   a first ground plane in the transition region of the external layer;
   a second ground plane disposed between the first inner trace routing layer and the second inner trace routing layer; and
   a second dielectric layer disposed between the first inner trace routing layer and the second ground plane;
   wherein the one or more stripline traces, the first ground plane, the second ground plane, the first dielectric layer, and the second dielectric layer form a stripline transmission line.

4. The multi-layer printed circuit board of claim 3, wherein:
   the clear routing region of the external layer does not include a ground plane;
   the second ground plane is disposed under the transition region and the clear routing region of the external layer; and
   the one or more microstrip traces, the second ground plane, and the second dielectric layer form a microstrip transmission line.

5. The multi-layer printed circuit board of claim 1, wherein at least one first via comprises a laser blind via and at least one second via comprises a laser blind via.

6. The multi-layer printed circuit board of claim 5, wherein each laser blind via electrically couples a pad on the external layer to a corresponding pad on corresponding clear routing layer.

7. The multi-layer printed circuit board of claim 1, wherein the electrical component comprises one of an integrated circuit package or a pluggable connector.

8. The multi-layer printed circuit board of claim 1, wherein, for one or more adjacent pairs of first vias in the transition region, a combination of a space between the pair of first vias and a required clearance between each first via and a trace is less than the second width.

9. A multi-layer printed circuit board comprising:
   an external layer having (i) a transition region configured to receive a first electrical component and (ii) a clear routing region outside of the transition region;
   a first inner trace routing layer disposed between the external layer and a second inner trace routing layer, the first inner trace routing layer comprising:
      a transition area disposed under the transition region of the external layer;
      a clear routing area outside of the transition area; and
      a transmission line that connects a given first via to a second via for a second electrical component, wherein the transmission line includes one or more conductive traces that each have a first width in the transition area and a second width in the clear routing area, wherein the second width is greater than the first width.

10. The multi-layer printed circuit board of claim 9, wherein the one or more conductive traces include one or more stripline traces in the transition area and one or more microstrip traces in the clear routing area.

11. The multi-layer printed circuit board of claim 10, further comprising:
   a first ground plane in the transition region of the external layer;
   a second ground plane disposed between the first inner trace routing layer and the second inner trace routing layer;
   a first dielectric layer disposed between the external layer and the first inner trace routing layer; and
   a second dielectric layer disposed between the first inner trace routing layer and the second ground plane;
   wherein the one or more stripline traces, the first ground plane, the second ground plane, the first dielectric layer, and the second dielectric layer form a stripline transmission line.

12. The multi-layer printed circuit board of claim 11, wherein:
   the clear routing region of the external layer does not include a ground plane;
   the second ground plane is disposed under the transition region and the clear routing region of the external layer; and
   the one or more microstrip traces, the second ground plane, and the second dielectric layer form a microstrip transmission line.

13. The multi-layer printed circuit board of claim 1, further comprising a plurality of vias including one or more first vias that extend from the transition region to the first inner trace routing layer and one or more second vias that extend from the transition region to the second inner trace routing layer, wherein at least one first via comprises a laser blind via and at least one second via comprises a laser blind via.

14. The multi-layer printed circuit board of claim 13, wherein each laser blind via electrically couples a pad on the external layer to a corresponding pad on corresponding clear routing layer.

15. The multi-layer printed circuit board of claim 13, wherein, for one or more adjacent pairs of first vias in the transition region, a combination of a space between the pair of first vias and a required clearance between each first via and a trace is less than the second width.

16. The multi-layer printed circuit board of claim 9, wherein the electrical component comprises one of an integrated circuit package or a pluggable connector.

17. A method for fabricating a multi-layer printed circuit board, the method comprising:
   generating a layout of traces for each trace routing layer of the printed circuit board, wherein the printed circuit board comprises a first core having an external layer, a second core having a first inner trace routing layer, and a third core having a second inner trace routing layer, wherein the external layer comprises (i) one or more transition regions configured to receive an electrical component and (ii) one or more clear routing regions outside of the one or more transition regions;
   etching conductive material from each inner trace routing layer to form transmission lines on each inner trace routing layer;
   attaching the first core to the second core using prepreg material;
   attaching the second core to the third core using prepreg material; and
   creating one or more first vias that extend from the transition region to the first inner trace routing layer and one or more second vias that extend from the transition region to the second inner trace routing layer, wherein:
      the first inner trace routing layer comprises:
         a transition area disposed under the transition region of the external layer;
         a clear routing area outside of the transition area; and
         a transmission line that includes one or more conductive traces that each have a first width in the transition area and a second width in the clear routing area, wherein the second width is greater than the first width.

18. The method of claim 17, wherein generating the layout of traces for each trace routing layer of the printed circuit board comprises:
   generating traces having the first width in one or more transition areas of each trace routing layer that will be disposed under a respective transition region of the external layer; and
   generating traces having the second width in one or more clear routing areas of each trace routing layer that is outside of each transition area outside of each transition area.

19. The method of claim 18, wherein the one or more conductive traces include one or more stripline traces in the transition area and one or more microstrip traces in the clear routing area.

20. The method of claim 18, wherein the printed circuit board comprises:
   a first ground plane in the transition region of the external layer;
   a second ground plane disposed between the first inner trace routing layer and the second inner trace routing layer; and
   a second dielectric layer disposed between the first inner trace routing layer and the second ground plane;
   wherein the one or more stripline traces, the first ground plane, the second ground plane, the first dielectric layer, and the second dielectric layer form a stripline transmission line.

* * * * *